(12) United States Patent
Hatta

(10) Patent No.: US 7,818,972 B2
(45) Date of Patent: Oct. 26, 2010

(54) WATER REMOVAL APPARATUS AND INSPECTION APPARATUS INCLUDING SAME

(75) Inventor: Masataka Hatta, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1015 days.

(21) Appl. No.: 11/488,039

(22) Filed: Jul. 18, 2006

(65) Prior Publication Data

US 2007/0030879 A1     Feb. 8, 2007

(30) Foreign Application Priority Data

Jul. 19, 2005    (JP)    ............................. 2005-208293
Apr. 25, 2006    (JP)    ............................. 2006-120592

(51) Int. Cl.
*F25B 27/00*      (2006.01)
(52) U.S. Cl. ........................ 62/238.1; 62/475
(58) Field of Classification Search ............... 62/238.1, 62/174, 503, 511, 512, 474, 475, 117, 513, 62/DIG. 2
See application file for complete search history.

(56) References Cited

U.S. PATENT DOCUMENTS

| | | | | |
|---|---|---|---|---|
| 3,779,036 A | * | 12/1973 | Girardin | ...................... 62/512 |
| 5,301,520 A | * | 4/1994 | Kitamura et al. | .............. 62/475 |
| 5,333,471 A | * | 8/1994 | Yamada | ...................... 62/476 |
| 6,807,820 B2 | * | 10/2004 | Aikawa et al. | ............. 62/238.3 |

* cited by examiner

*Primary Examiner*—Mohammad M Ali
(74) *Attorney, Agent, or Firm*—Oblon, Spivak, McClelland, Maier & Neustadt, L.L.P.

(57) ABSTRACT

A water removal apparatus removes water contained in a coolant circulating between a target object and a cooling system through a circulation line. The water removal apparatus includes a bypass line through which a part of the coolant separated from the circulation line flows; a heat exchanger, provided in the bypass line, for heating the coolant flowing along the bypass line by using a waste heat of the cooling system; and a water adsorption material, provided at a downstream side of the heat exchanger, for adsorbing the water contained in the coolant. Further, an inspection apparatus, for performing an inspection for a semiconductor wafer mounted on the target object while controlling a temperature of the semiconductor wafer on the target object, includes the water removal apparatus.

8 Claims, 3 Drawing Sheets

WATER REMOVAL APPARATUS AND INSPECTION APPARATUS INCLUDING SAME

FIELD OF THE INVENTION

The present invention relates to an apparatus for removing water in a coolant circulating through a cooling circuit, and an inspection apparatus including the same; and, more particularly, to an apparatus capable of removing water contained in the coolant without interrupting a cooling of a target object, and an inspection apparatus including the water removal apparatus.

BACKGROUND OF THE INVENTION

As a water removal apparatus, for example, Japanese Patent Laid-open Publication No. 2001-050624 (Reference 1) discloses a cooling apparatus. In such a cooling apparatus, a water removal filter is disposed at a cooling liquid outlet port of a cooling liquid receiving tank provided on a circulation passageway of a cooling liquid so as to send the cooling liquid to a target object after removing water therefrom.

Further, Japanese Patent Laid-open Publication No. 2001-141341 (Reference 2) discloses an air conditioner including a water removal apparatus. In this air conditioner, there is provided, between an outdoor heat exchanger and an expansion valve or a capillary tube, a bypass circuit including a dryer having at its central portion a filter for capturing foreign materials such as dirt, powdered metal or the like during a cooling cycle. The dryer (particularly a molecular sieve) adsorbs and removes water in the coolant passing through the bypass circuit.

Moreover, there has been proposed in Japanese Patent Laid-open Publication No. H05-180538 (Reference 3) a water removal apparatus of a cooling system. In the water removal apparatus, a cooling cylinder for cooling a coolant is disposed on the middle of a bypass passageway for the coolant and a filter for capturing water contained in the coolant is provided at a downstream of the cooling cylinder. After the coolant from the bypass passageway is cooled by the cooling cylinder, the water in the coolant is separated and removed from the coolant.

Furthermore, among the cooling systems, there is a type that cools a target object down to minus several tens of degrees Celsius such as that employed in an inspection apparatus for performing a low temperature inspection for an object to be processed such as a semiconductor wafer. In this case, for example, if a fluorine-based coolant is used and water is dissolved in the coolant, the water is cooled to be frozen on the surface of the heat exchanger of the cooling system and grows to frost or ice, so that the heat transfer efficiency of the heat exchanger and hence the cooling capability of the cooling system are gradually deteriorated. As an approach of solving the above problem, conventionally, after the operation of the cooling system is stopped, the coolant is taken out from the cooling system and the water dissolved in the coolant is removed therefrom by using an external water adsorption filter. Further, the water attached in the heat exchanger and/or the circulation line of the coolant is cleaned out by using, e.g., ethyl alcohol, and a large amount of dry air is blown into the heat exchanger and/or the circulation line to dry the inside thereof.

However, as in the conventional cooling system, if the coolant is taken out from the cooling system to remove the water from the coolant by using the water adsorption filter externally, and additionally or alternatively if the water attached in the heat exchanger and/or the coolant circulation line is cleaned out by using, e.g., the ethyl alcohol and the inside thereof is then dried by using the dry air, the operation efficiency of the cooling system is deteriorated. Further, if the water removal filter is installed on the passageway for the coolant of a low temperature as disclosed in References 1 to 3, the water is frozen to the filter to occlude the latter, which requires the stop of the cooling system.

SUMMARY OF THE INVENTION

It is, therefore, an object of the present invention to provide a water removal apparatus wherein water contained in a coolant can be removed without stopping a cooling system, thereby increasing the operation efficiency of the cooling system, and an inspection apparatus including the water removal apparatus.

In accordance with a preferred embodiment of the present invention, there is provided a water removal apparatus for removing water contained in a coolant circulating between a target object and a cooling system through a circulation line, the apparatus including: a bypass line through which a part of the coolant separated from the circulation line flows; a heat exchanger, provided in the bypass line, for heating the coolant flowing along the bypass line by using a waste heat of the cooling system; and a water adsorption material, provided at a downstream side of the heat exchanger, for adsorbing the water contained in the coolant.

The water removal apparatus may further include a first and a second valve provided at an upstream and a downstream side of the water adsorption material, respectively.

Further, the water removal apparatus may further include a coolant flow rate restriction unit provided at a downstream side of the second valve.

In addition, the water removal apparatus may further include a third valve arranged parallel to the flow rate restriction unit.

In accordance with another preferred embodiment of the present invention, there is provided an inspection apparatus having a mounting body for mounting thereon an object to be processed; a cooling system for cooling a coolant whose temperature is increased while circulating between the mounting body and the cooling system through a circulation line; and a water removal apparatus for removing water contained in the coolant, the inspection apparatus performing an inspection for the object while controlling a temperature of the object on the mounting body, wherein the water removal apparatus include: a bypass line through which a part of the coolant separated from the circulation line flows; a heat exchanger, provided in the bypass line, for heating the coolant flowing through the bypass line by using a waste heat of the cooling system; and a water adsorption material, provided at a downstream side of the heat exchanger, for adsorbing the water contained in the coolant.

In the inspection apparatus, the water removal apparatus may further include a first and a second valve provided at an upstream and a downstream side of the water adsorption material, respectively.

Further, in the inspection apparatus, the water removal apparatus may further include a coolant flow rate restriction unit provided at a downstream side of the second valve.

In addition, in the inspection apparatus, the water removal apparatus may further include a third valve arranged parallel to the flow rate restriction unit.

In accordance with the present invention, there is provided a water removal apparatus capable of removing water contained in a coolant without stopping an operation of a cooling system, thereby increasing an operation efficiency thereof, and an inspection apparatus including the water removal apparatus.

BRIEF DESCRIPTION OF THE DRAWINGS

The above and other objects and features of the present invention will become apparent from the following description of preferred embodiment given in conjunction with the accompanying drawings, in which.

DETAILED DESCRIPTION OF THE PREFERRED EMBODIMENTS

Figure 1:
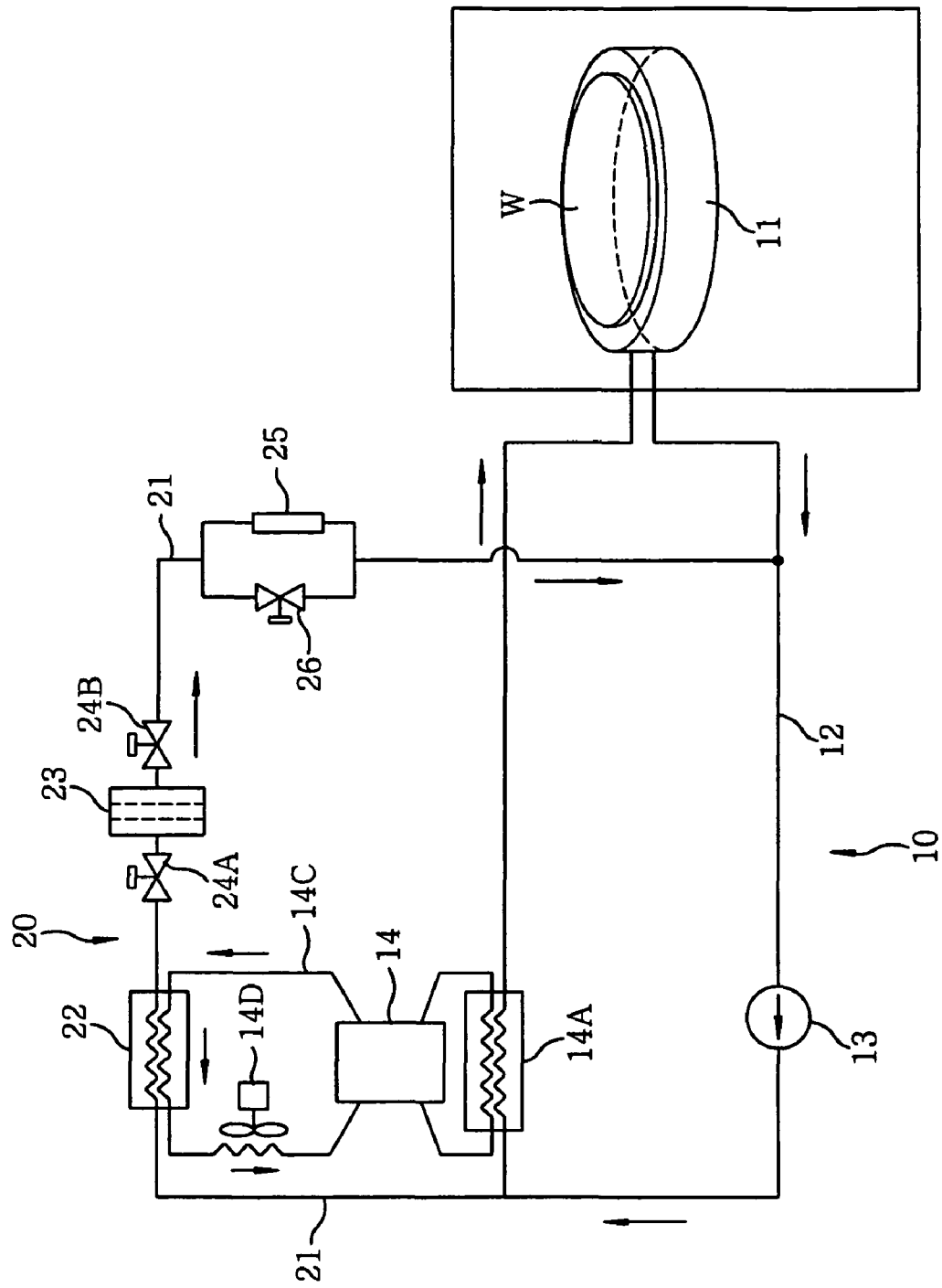
FIG. 1 is a block diagram conceptually showing an inspection apparatus employing a water removal apparatus of the present invention.
Figure 2:
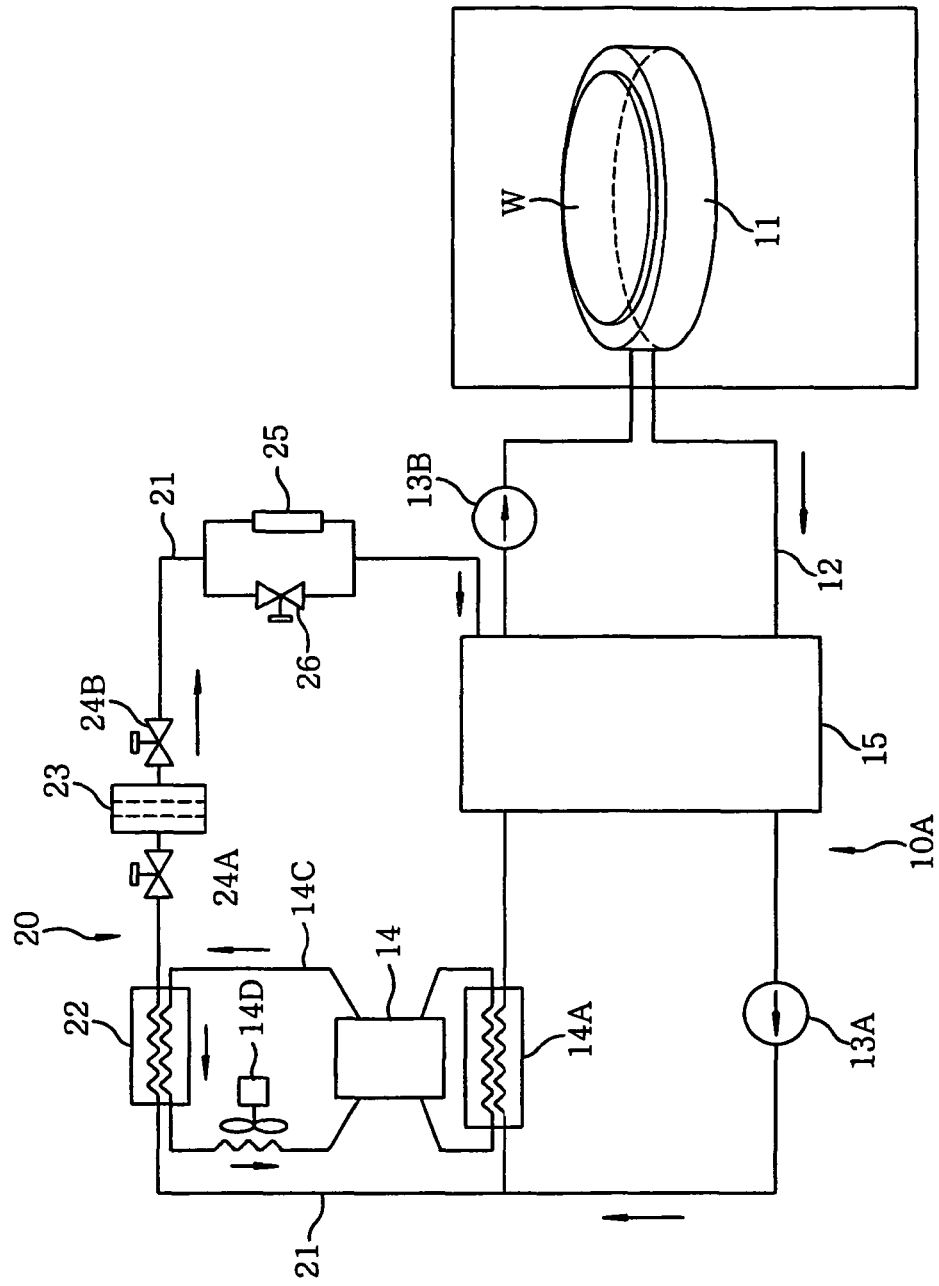
FIG. 2 shows a block diagram showing a modification of the inspection apparatus employing the water removal apparatus of the present invention shown in FIG. 1.
Figure 3:
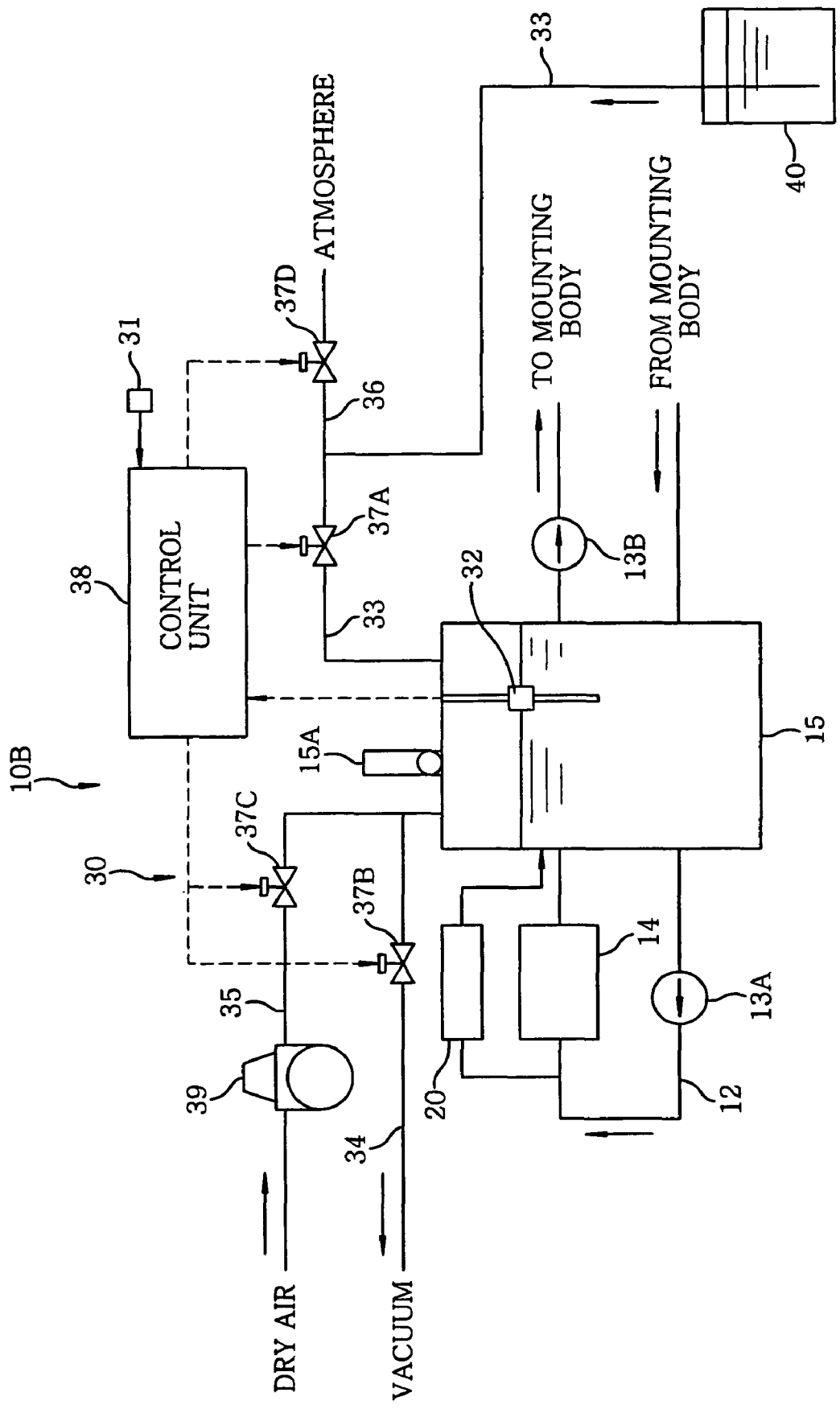
FIG. 3 depicts a block diagram showing main parts of the modification shown in FIG. 2.

Hereinafter, preferred embodiments of the present invention will be described with reference to FIGS. 1 to 3. FIG. 1 is a block diagram conceptually showing an inspection apparatus employing a water removal apparatus of the present invention; FIG. 2 shows a block diagram showing a modification of the inspection apparatus employing the water removal apparatus of the present invention shown in FIG. 1; and FIG. 3 depicts a block diagram showing main parts of the modification shown in FIG. 2.

First Preferred Embodiment

The inspection apparatus 10 in accordance with a first preferred embodiment includes, as shown in FIG. 1 for example, a mounting body 11 for mounting thereon an object to be processed (e.g., a semiconductor wafer) W; a pump 13 connected to the mounting body 11 through a circulation line 12 and serving to force a coolant to be circulated into the mounting body 11; and a first heat exchanger 14A of a cooling system 14 for cooling down the coolant of an increased temperature circulated through the circulation line by the pump 13 to an inherent temperature thereof. The coolant is circulated into the mounting body 11 to cool the semiconductor wafer W thereon, so that the inspection apparatus inspects electric characteristics of the semiconductor wafer W at a desired temperature. The mounting body 11 is horizontally and vertically movable to make the semiconductor wafer W contact with a probe card (not shown) during the inspection.

The mounting body 11 is cooled by the coolant, so that it is possible to inspect the electric characteristics of the semiconductor wafer W at an appropriate temperature within, e.g., a range of minus several tens of degrees Celsius to 150° C. In this case, for example, a fluorine-based nonreactive liquid (Fluorinert™ made by Sumitomo 3M Limited, Galden™ made by Solvay Solexis, Inc. and the like) may be used as the coolant. While the coolant is circulated between the mounting body 11 and the first heat exchanger 14A, it is inevitable that water is introduced and dissolved in the coolant.

To that end, as shown in FIG. 1, a water removal apparatus 20 is installed in the inspection apparatus of this embodiment. The water removal apparatus 20 includes a bypass line 21 through which a part of the coolant circulating along the circulation line 12 flows, a second heat exchanger 22, disposed on the bypass line 21, for heating the coolant flowing through the bypass line 21 by using a waste heat of the cooling system 14, and a water adsorption material 23, disposed at a downstream of the second heat exchanger 22, for adsorbing the water contained in the coolant. The bypass line 21 is connected at its one end to a downstream side of the pump 13 at an upstream side of the first heat exchanger 14A, and at the other end to an upstream side of the pump 13.

The refrigerant for the cooling system 14 flows through the cooling circuit in the direction indicated by the arrows in FIG. 1, so that it absorbs heat from the coolant in the circulation line 12 while passing through the first heat exchanger 14A. The refrigerant whose temperature is increased by the heat absorption circulates through the refrigerating circuit 14C and radiates heat at the second heat exchanger 22 to heat the low temperature coolant flowing through the bypass line 12. Even though the coolant contains water which would be frozen while circulating through the circulation line 12, the frozen water is heated and liquefied at the second heat exchanger. Accordingly, the water adsorption material 23 can surely adsorb the water in the coolant.

A first and a second cut-off valve 24A and 24B are installed at the upstream and the downstream side of the water adsorption material 23, respectively, and the first and the second cut-off valve 24A and 24B can be closed if it is necessary to replace the water adsorption material 23 with a new one. As the water adsorption material 23, a porous hydrophilic adsorption material, such as zeolite or the like, may be used. Further, provided in the bypass line 21 is a flow rate restriction unit (e.g., capillary tube) 25 for restricting a flow rate of the coolant. The capillary tube 25 restricts a flow rate of the coolant flowing through the bypass line 21 during a normal operation to thereby prevent a deterioration in a cooling capability of the coolant flowing through the circulation line 12. Moreover, a bypass valve 26 is arranged parallel to the capillary tube 25. Therefore, if necessary, by opening the bypass valve 26, it is possible to increase the flow rate of the coolant flowing through the bypass line 21 and, thus, a large amount of the water can be adsorbed in a short time by the water adsorption material 23.

Since there remains a residual heat at the second heat exchanger 22 even though the latter uses heat to heat the coolant, a heat radiator 14D radiates the residual heat to prevent a deterioration in a cooling efficiency of the cooling system 14.

Hereinafter, an operation of the apparatus will be described. In order to inspect a semiconductor wafer W, the mounting body 11 is cooled by circulating a coolant therein at a fixed flow rate with the use of the pump 13. As the mounting body 11 is cooled, the semiconductor wafer W thereon is cooled and maintained at a specified temperature even though a heat is generated in the semiconductor wafer W during the inspection. Further, while the coolant circulates through the circulation line 12, water is contained and dissolved therein. If such state is neglected, the water is frozen in the first heat exchanger 14A, thereby deteriorating the cooling efficiency of the cooling system 14. To that end, in this embodiment, the water removal apparatus 20 is provided to remove the water from the coolant. Such water removal apparatus 20 is operated while the inspection apparatus 10 is used.

The following is a description on an operation of the water removal apparatus 20. While the coolant is circulated through the circulation line 12 by the pump 13, a part of the coolant is introduced from the circulation line 12 into the bypass line 21 at a restricted flow rate controlled by the capillary tube 25. Such coolant reaches the second heat exchanger 22 via the bypass line 21 and then is heated by a waste heat of the cooling system 14, so that even frozen water in the coolant is liquefied. The water contained in the coolant is adsorbed by the water adsorption material 23 and thus removed therefrom. Then, the coolant devoid of water is returned to an upstream side of the pump 13 via the capillary tube 25.

As described above, the water removal apparatus 20 takes out a part of the coolant from the circulation line 12 and then removes water from the coolant. Therefore, even if water is contained in the coolant while the inspection apparatus 10 is being operated, it is possible to prevent the water from being frozen in the circulation line 12 and the first heat exchange 14A by continuously and surely removing the water from the coolant. Accordingly, the semiconductor wafer W on the mounting body 11 can be maintained at a desired temperature without deteriorating the cooling efficiency of the cooling system 14. Moreover, since there is no need to stop the operation of the inspection apparatus 10, it is possible to improve an operating efficiency thereof and lengthen a maintenance work cycle therefor.

If it is required to replace the water adsorption material 23 with a new one, it can be carried out merely by closing the first and the second cut-off valve 24A and 24B to temporarily stop the water removing operation while the inspection apparatus 10 is operated. Besides, in case the water in the coolant has been abruptly increased due to the maintenance work or the like, a large amount of coolant is made to pass through the water adsorption material 23 by opening the bypass valve 26 arranged parallel to the capillary tube 25, so that a large amount of the water can be adsorbed in a short time.

As described above, in accordance with this embodiment, the water removal apparatus 20 includes the bypass line 21 through which a part of the coolant separated from the circulation line 12 flows; the second heat exchanger 22 provided in the bypass line 21, for heating the coolant flowing through the bypass line 21 by using a waste heat of the cooling system 14; and the water adsorption material 23 provided at a downstream side of the heat exchanger 22, for adsorbing water contained in the coolant. Accordingly, the water in the coolant can be certainly removed without stopping the operation of the inspection apparatus 10, thereby improving the operating efficiency of the inspection apparatus 10.

Further, since the first and the second cut-off valve 24A and 24B are provided at an upstream and a downstream side of the water adsorption material 23, respectively, in case the water adsorption material 23 is no longer usable, it can be simply replaced only by temporarily stopping the water removing operation by way of closing the first and the second cut-off valve 24A and 24B without stopping the operation of the inspection apparatus 10. Moreover, since the capillary tube 25 for restricting a flow rate of the coolant is provided at a downstream side of the second cut-off valve 24B, it is possible to prevent deterioration in the cooling capability of the coolant circulating through the circulation line 12 by restricting the flow rate of the coolant drawn to the bypass line 21. Furthermore, when a large amount of the water in the coolant needs to be removed in a short time, a large amount of coolant is made to pass through the water adsorption material 23 by opening the bypass valve 26 arranged parallel to the capillary tube 25. Accordingly, a large amount of water can be removed in a short period of time.

Second Preferred Embodiment

An inspection apparatus 10A in accordance with a second preferred embodiment of the present invention has a substantially same configuration as that of the first preferred embodiment except that a low temperature coolant tank 15 is provided in the circulation line 12 and, further, a first and a second pump 13A and 13B are provided at an upstream and a downstream side of the low temperature coolant tank 15, respectively, as illustrated in FIG. 2. Therefore, identical or similar parts to those described in the first preferred embodiment will be represented by like reference numerals, and redundant descriptions thereon will be omitted.

In this embodiment, the first pump 13A returns a coolant of an increased temperature from the mounting body 11 to the low temperature coolant tank 15 and forces a part of the coolant to flow through the bypass line 21 and then return to the low temperature coolant tank 15 via the water adsorption material 23. Meanwhile, the second pump 13B forces the low temperature coolant cooled by the cooling system 14 to flow into the mounting body 11. In this embodiment as well, the water removal apparatus 20 removes water dissolved in the coolant whose temperature is increased while flowing through the bypass line 21 by using the water adsorption material 23 and the coolant devoid of water is then returned to the low temperature coolant tank is.

Third Preferred Embodiment

As illustrated in FIG. 3, an inspection apparatus 10B in accordance with a third preferred embodiment of the present invention includes the circulation line 12 for circulating a coolant through the mounting body (not shown in FIG. 3); the low temperature coolant tank 15 provided in the circulation line 12; the first and the second pump 13A and 13B provided at an upstream and a downstream side of the low temperature coolant tank 15, respectively; and the cooling system 14 and the water removal apparatus 20 provided between the first pump 13A and the low temperature coolant tank 15, which is substantially the same configuration as that of the second preferred embodiment. Therefore, as in the second preferred embodiment, while the coolant in the low temperature coolant tank 15 is circulated by the first pump 13A, the cooling system 14 cools the coolant and, also, the water removal apparatus 20 removes water from the coolant.

However, since the installation space of the inspection apparatus 10B is required to be reduced as those of other semiconductor manufacturing apparatuses, the installation space of the cooling system for the mounting body is also restricted. Thus, the cooling system is installed at a high position above other devices in consideration of a maintenance work of the latter without providing a separate space of the low temperature coolant tank 15 to thereby prevent a footprint from increasing due to the low temperature coolant tank 15. Accordingly, a coolant filling opening of the low temperature coolant tank 15 is located at a high position. As a result, in order to fill the low temperature coolant tank 15 with the coolant, a coolant vessel containing a coolant needs to be lifted. However, such high-lift work causes a large operation load and a possibility of scattering the coolant.

Therefore, in this embodiment, a coolant filling mechanism 30 is provided to solve the drawbacks of the high-lift work. As depicted in FIG. 3, the coolant filling mechanism 30 is configured to depressurize an inner space of the low temperature coolant tank 15, so that the coolant in the coolant vessel 40 is drawn into the low temperature coolant tank 15.

Specifically, as shown in FIG. 3, the coolant filling mechanism 30 includes a switch 31 for triggering a filling of the coolant, a liquid surface sensor 32 provided in the low temperature coolant tank 15, a coolant introduction line 33 connected to a top wall of the low temperature coolant tank 15, a vacuum line 34 communicating with the inner space of the low temperature coolant tank 15, a dry air supply line 35 branched from the vacuum line 34, an atmosphere line 36 branched from the coolant inlet line 33, a first to a fourth solenoid valve 37A to 37D provided in the aforementioned lines, respectively, and a controller 38 for controlling the solenoid valves 37A to 37D.

As shown in FIG. 3, the first solenoid valve 37A is attached on the coolant inlet line 33; the second solenoid valve 37B is attached on the vacuum line 34; the third solenoid valve 37C is attached on the air supply line 35; and the fourth solenoid valve 37D is attached on the atmosphere line 36. Moreover, a pressure regulator 39 is provided at an upstream side of the third solenoid valve 37C on the air supply line 35 to thereby control the dry air to be supplied into the low temperature coolant tank 15 at a specified pressure. Further, in FIG. 3, reference numeral 15A denotes a safety valve.

In case the switch 31 is pushed, the first and the second solenoid valve 37A and 37B are opened by the controller 38 to open the lines 33 and 34, respectively, thereby introducing the coolant from the coolant vessel 40 into the low temperature coolant tank 15. In case the liquid surface sensor 32 detects the coolant at a predetermined level, the first and the second valve 37A and 37B are closed to thereby close the lines 33 and 34, respectively. When the first and the second solenoid valve 37A and 37B are closed, the third solenoid valve 37C is opened by the controller 38 to open the air supply line 35, so that the dry air is supplied into the low temperature coolant tank to purge water therein for a specified time period and the third solenoid valve 37C is then closed. Furthermore, after the third solenoid valve 37C is closed, the fourth solenoid valve 37D is opened by the controller 38 to open the atmosphere line for a specified time period, so that the coolant remaining in the coolant introduction line 33 returns into the coolant vessel 40. Thereafter, the fourth solenoid valve 37D is closed.

Hereinafter, an operation of the coolant filling mechanism 30 will be described. In case of filling the low temperature coolant tank 15 with a coolant, the coolant introduction line 33 is fitted into an opening of the coolant vessel 40 and the switch 31 is then pushed, so that the first and the second solenoid valve 37A and 37B are actuated by the controller 38 to open the coolant introduction line 33 and the vacuum line 34. Then, the inner space of the low temperature coolant tank 15 is depressurized and the coolant in the coolant vessel 40 is drawn into the low temperature coolant tank 15. When a predetermined amount of the coolant is introduced into the low temperature coolant tank 15, the first and the second solenoid valve 37A and 37B are closed by the controller 38 in response to an operation of the liquid surface sensor 32 and, thus, the respective lines 33 and 34 are closed.

Thereafter, the third solenoid valve 37C is actuated by the controller 38 to open the air supply line 35. Next, a dry air is blown at a specified pressure into the low temperature coolant tank 15 for a specified time period to purge water in the low temperature coolant tank 15 through the safety valve 15A and, then, the third solenoid valve 37C is closed automatically. At the same time, the fourth solenoid valve 37D is actuated by the controller 38, so that the atmosphere line 36 is opened to the atmosphere for a specified time period to return the coolant remaining in the coolant inlet line 33 into the coolant vessel 40, and then the fourth solenoid valve 37D is automatically closed.

As described above, in accordance with this embodiment, the same effects as those of the aforementioned embodiments can be achieved. Further, it is possible to fill the low temperature coolant tank 15 with the coolant without carrying out the high-lift work. Moreover, the coolant filling mechanism 30 can be widely applied to semiconductor manufacturing apparatuses having a coolant tank without being limited to the inspection apparatus 10B.

Although, in the aforementioned embodiments, zeolite is exemplified as the water adsorption material, any adsorption materials other than the zeolite may be used as long as they can adsorb the water. Besides, although the capillary tube has been described as a coolant flow rate restriction unit, the present invention is not limited thereto. Moreover, the water removal apparatus of the present invention may also be applied to an inspection apparatus having a low temperature coolant tank and two or more pumps as shown in FIG. 2. In other words, the present invention may be variously modified within the scope of the present invention.

The present invention is applicable to semiconductor manufacturing apparatuses including the inspection apparatus.

While the invention has been shown and described with respect to the preferred embodiments, it will be understood by those skilled in the art that various changes and modification may be made without departing from the scope of the invention as defined in the following claims.

What is claimed is:

1. A water removal apparatus for removing water contained in a coolant circulating through a target object, the apparatus comprising:
   a circulation line through which the coolant circulates through the target object;
   a pump disposed in the circulation line which circulates the coolant through the target object;
   a bypass line through which a part of the coolant separated from the circulation line flows;
   a cooling system, having a separate cooling circuit, which cools the coolant by heat transfer with a refrigerant circulating the cooling system through a first heat exchanger provided in the circulation line;
   a second heat exchanger, provided in the bypass line, which heats the coolant flowing along the bypass line by using a waste heat of the cooling system; and
   a water adsorption material, disposed in the bypass line and provided at a downstream side of the second heat exchanger, which adsorbs the water contained in the coolant heated by the second heat exchanger.

2. The water removal apparatus of claim 1, further comprising a first and a second valve provided at an upstream and a downstream side of the water adsorption material, respectively.

3. The water removal apparatus of claim 2, further comprising a coolant flow rate restriction unit provided at a downstream side of the second valve.

4. The water removal apparatus of claim 3, further comprising a third valve arranged parallel to the flow rate restriction unit.

5. An inspection apparatus having a mounting body for mounting thereon an object to be processed; and a water removal apparatus for removing water contained in a coolant circulating through the object to be processed, the inspection apparatus performing an inspection for the object while controlling a temperature of the object on the mounting body, wherein the water removal apparatus includes:
   a circulation line through which the coolant circulates through the target object;
   a pump disposed in the circulation line which circulates the coolant through the target object:
   a bypass line through which a part of the coolant separated from the circulation line flows;
   a cooling system, having a separate cooling circuit, which cools the coolant by heat transfer with a refrigerant circulating the cooling system through a first heat exchanger provided in the circulation line;

a second heat exchanger, provided in the bypass line, which heats the coolant flowing through the bypass line by using a waste heat of the cooling system; and a water adsorption material, disposed in the bypass line and provided at a downstream side of the second heat exchanger, which adsorbs the water contained in the coolant heated by the second heat exchanger.

6. The inspection apparatus of claim 5, wherein the water removal apparatus further includes a first and a second valve provided at an upstream and a downstream side of the water adsorption material, respectively.

7. The inspection apparatus of claim 6, wherein the water removal apparatus further includes a coolant flow rate restriction unit provided at a downstream side of the second valve.

8. The inspection apparatus of claim 7, wherein the water removal apparatus further includes a third valve arranged parallel to the flow rate restriction unit.

* * * * *